(12) United States Patent
Wolter et al.

(10) Patent No.: US 7,274,102 B2
(45) Date of Patent: Sep. 25, 2007

(54) CONTACTING DEVICE, TESTING METHOD AND CORRESPONDING PRODUCTION METHOD

(75) Inventors: Andreas Wolter, Pliening (DE); Jorg Zapf, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/374,391

(22) Filed: Mar. 13, 2006

(65) Prior Publication Data

US 2006/0214279 A1 Sep. 28, 2006

(30) Foreign Application Priority Data

Mar. 22, 2005 (DE) .................. 10 2005 013 323

(51) Int. Cl.
*H01L 23/48* (2006.01)
*H01L 23/52* (2006.01)

(52) U.S. Cl. .................. 257/738; 257/734; 257/737; 257/739; 257/773; 257/776; 257/E23.021

(58) Field of Classification Search ........ 257/734–739, 257/773–776, 778, E23.021, E23.068, E23.069, 257/E21.503, E21.508, E21.511, E21.524; 228/180.22; 438/613–617

See application file for complete search history.

(56) References Cited

U.S. PATENT DOCUMENTS 5,487,999 A 1/1996 Farnworth
5,716,218 A 2/1998 Farnworth et al.
5,876,580 A 3/1999 Lykins, II
6,133,066 A * 10/2000 Murakami .................. 438/108
2002/0053735 A1* 5/2002 Neuhaus et al. ............. 257/728
2003/0067755 A1 4/2003 Haimerl et al.
2003/0218252 A1* 11/2003 Suzuki et al. ................ 257/737
2004/0140571 A1* 7/2004 Tomura et al. .............. 257/778
2004/0174176 A1 9/2004 Kirby

FOREIGN PATENT DOCUMENTS

| DE | 10324450 | 1/2005 |
|---|---|---|
| DE | 69533336 | 1/2005 |
| DE | 10353676 | 6/2005 |

OTHER PUBLICATIONS

German Office Action dated Aug. 26, 2005.

* cited by examiner

*Primary Examiner*—Jasmine Clark
(74) *Attorney, Agent, or Firm*—Jenkins, Wilson, Taylor & Hunt, P.A.

(57) ABSTRACT

A contacting device comprises a carrier device with a first surface, a plurality of first terminal regions on the first surface, at least one elastic elevation on the first surface, and a plurality of interconnects, each running from a respective of the first terminal regions to an upper side of the elastic elevation. The plurality of first terminal regions is configured so that signals of a tester device can be fed to the plurality of first terminal regions, the interconnects have first contact regions located at the upper side of the elastic elevation configured to be contacted electrically with corresponding second contact regions of an integrated circuit, and the first contact regions comprise first particles for roughening the surface of the first contact regions.

9 Claims, 4 Drawing Sheets

A ←           → A'

A ← → A'

CONTACTING DEVICE, TESTING METHOD AND CORRESPONDING PRODUCTION METHOD

BACKGROUND OF THE INVENTION

1. Field of the Invention

The present invention relates to a contacting device for the contacting of an integrated circuit, in particular of a chip or a wafer, with a tester device, a corresponding testing method and a corresponding production method.

Although it can be applied in principle to any integrated circuits or components, the present invention and the problem on which it is based are explained with reference to chips with integrated circuits using silicon technology.

2. Description of the Prior Art

The increasing production density of today's electronic circuits or electronic circuit units, also referred to as chips, is leading to increased requirements for testing. Before delivery, the electronic circuit units must be subjected to various tests. In a conventional way, the electronic circuit units accommodated in packages are inserted into special test sockets and thereby contacted at the package contacts. For the contacting of unpackaged chips, needle cards, which usually have resilient contact pins, are used.

During the contacting, the circuit units to be tested are subjected to various test conditions. For example, series of tests are conducted at an elevated temperature over a prolonged period of time, for example 120° C. for a time period of 24 hours. These series of tests are also referred to as "burn-in". Long test times can rapidly lead here to high costs of testing and to commercial disadvantages.

For the efficient contacting of the circuit units to be tested, it has been proposed to provide sockets into which the circuit units to be tested are introduced.

A major disadvantage of known methods for the contacting of electronic circuit units is that these circuit units have to be provided with a package and corresponding terminal contacts outside the package.

Conventional contacting devices cannot be used for circuit units to be tested without a package, i.e. so-called "bare chips". There is an increasing demand for provision of so-called multi-chip modules, i.e. various chips or circuit units are accommodated in a single module.

It is quite possible here for the individual circuit units to be supplied by different manufacturers. One important aspect in the delivery of circuit units without a package is that the circuit units must be inspected for defects just as carefully as the packaged circuit units.

Most widespread are chips with contact areas of aluminum. An electrical measurement of such unpackaged chips is currently carried out with needle adaptors. The needles perforate the thin oxide skin of the aluminum and lead to a good, low-impedance contact. Corresponding measuring devices are complex, expensive and unsuitable for a multi-hour burn-in. Published German patent application 103 24 450 A1 discloses an example of a known contacting device.

SUMMARY OF THE INVENTION

It is an object of the present invention to provide an improved contacting device for the contacting of an integrated circuit, in particular of a chip or a wafer, with a tester device, a corresponding testing method and a corresponding production method, which ensure a more reliable low-impedance temporary electrical contact even in the case of contact metals with a thin surface oxide which is also suitable for a burn-in.

The object is achieved in accordance with the invention by means of a contacting device for the contacting of an integrated circuit with a tester device, comprising a carrier device with a first surface, a plurality of first terminal regions on the first surface, to which signals of the tester device can be fed; at least one elastic elevation on the surface; and a plurality of interconnects, which respectively run from a first terminal region to the upper side of the elastic elevation; wherein the regions of the interconnects form on the upper side of the elastic elevation first contact regions, which can be brought into electrical contact with corresponding contact regions of the integrated circuit, and the interconnects are roughened, at least in the regions, by particles for roughening the surface being incorporated in the regions.

The idea on which the present invention is based is to use a contact system in which the ends of the contact elements of the integrated circuit and the substrate are placed one on top of the other and are simultaneously under a certain compressive pressure, the interconnects being roughened at least in the contact regions, so that a thin oxide on contact regions of the integrated circuit can be easily perforated.

The contact surfaces of the contact structures on both sides should be of such a nature that they are stable over a long time with regard to the pressure contact and have good electrical functionality. It must also be ensured that the material of the elastic elevations retains the desired elasticity in the entire application range.

The inventive elastic contact structure makes it possible to compensate for differences between the materials involved in the linear expansion in the connecting plane, and also to ensure a reliable electrical contact between the materials involved in the direction of compression.

The inventive contacting devices can be produced at very low cost and are suitable for contacting contact areas with a thin oxide reliably and with low impedance. The contact elements are temperature-resistant up to at least 150° C. and consequently also suitable for burn-in processes of memory chips.

The elastic elevation may be comprised of an elastomer, particles for roughening the surface of the elastic elevation being incorporated or applied and that this roughening is molded into the regions.

The particles for roughening the surface may be incorporated in the regions, protuberances for roughening the surface may be incorporated in the regions, the particles may have a grain size in the range of 3 to 20 μm, the interconnects may be produced from copper, the interconnects may be coated with nickel and finally with hard gold, the at least one elastic elevation may have an elongate wall-like form, at least two elastic elevations may be provided, running substantially parallel to each other, and a plurality of second terminal regions may be provided on a second surface, to which signals of the tester device can be fed, the first and second terminal regions being connected to each other by means of via holes.

DESCRIPTION OF THE PREFERRED EMBODIMENTS

Figure 1:
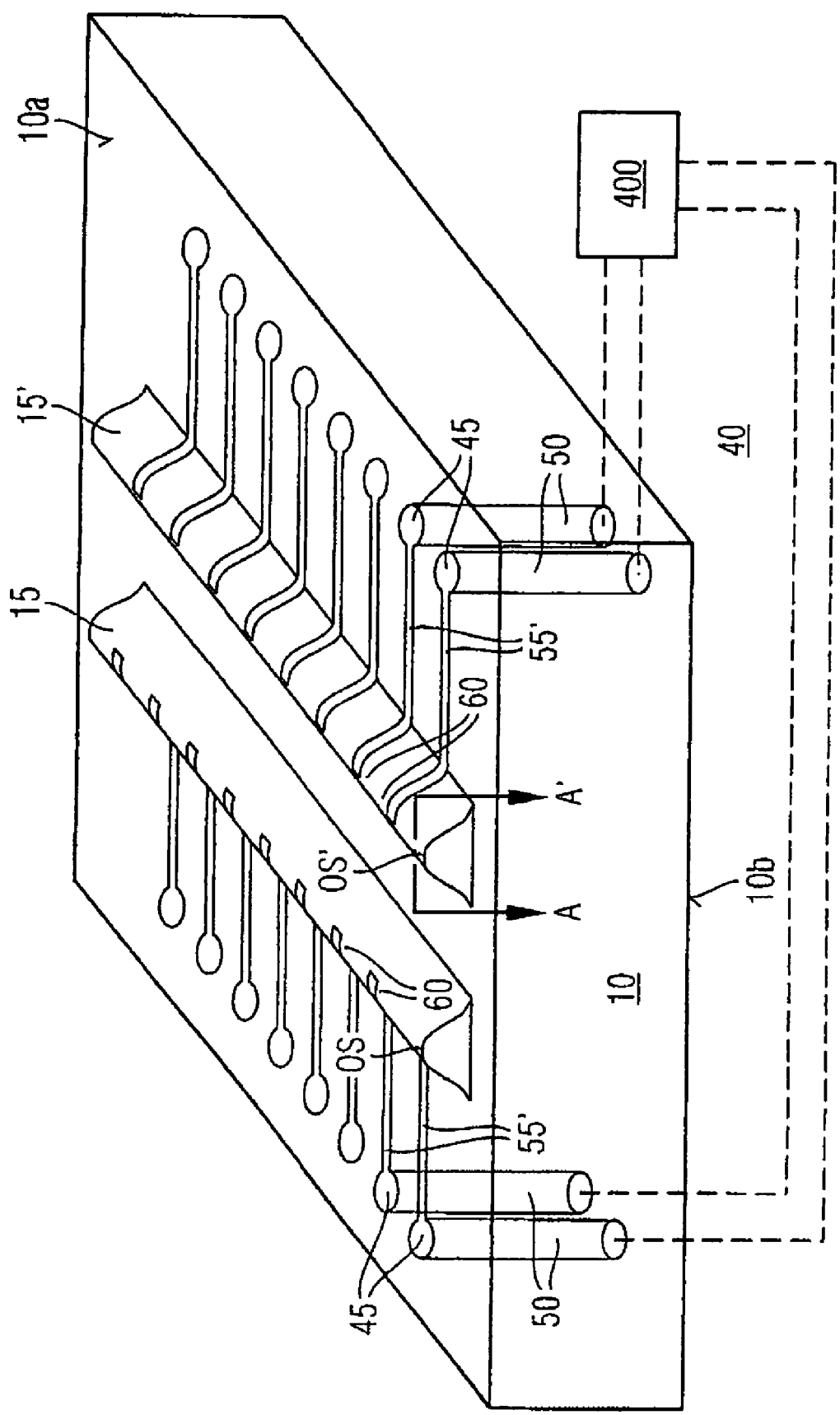
FIG. 1 is a schematic representation of an exemplary embodiment of an inventive contacting device.

In the figures, the same reference numerals designate components which are the same or functionally the same.

Without restricting generality, in the two exemplary embodiments explained below the integrated circuit is a chip.

FIG. 1 is a schematic representation of a contacting device according to a first embodiment of the present invention.

In FIG. 1, reference numeral 10 designates a carrier device of an organic material or of silicon or a ceramic, which has a rectangular form and a first, upper surface 10a and a second, lower surface 10b.

On the upper surface 10a there are two elastic elevations 15, 15' of an elastomer, such as for example silicone, polyurethane or flexibilized epoxy. The elastic elevations have an elongate, wall-shaped form and follow in their shape the contact areas to be contacted of the chip to be tested. They may be applied, for example, by a printing process or by dispensing.

A plurality of first terminal regions 45 are provided on a first surface 10a, to be precise in respective rows parallel to the first and second elastic elevations 15, 15'. Starting from the first terminal regions 45, interconnects 55' run to the upper side OS and OS', respectively, of the elastic elevations 15, 15'.

Figure 6:
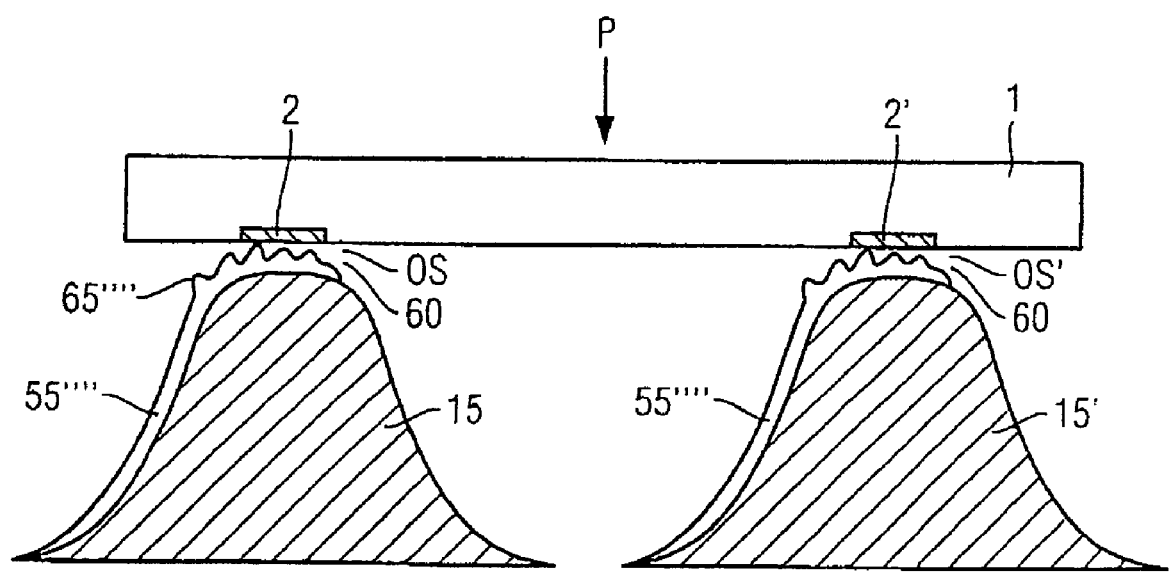
FIG. 6 is a cross-sectional view of two elastic contact elements of the contacting device according to a fourth embodiment of the present invention along the line A-A' in FIG. 1 with a chip placed on and pressed into place for testing.

The end regions 60 of the interconnects 55' form on the upper sides OS and OS', respectively, of the elastic elevations 15, 15' first contact regions, which can be brought into electrical contact with corresponding contact regions 2, 2' of the integrated circuit 1 (compare FIG. 6). As a result of how they are produced, the interconnects 55' are roughened in such a way that, in the regions 60, a thin oxide on contact regions 2, 2' of the integrated circuit 1 can be perforated when pressure is applied, so that a secure low-impedance contact is possible even in the case of slightly corroded contact areas of the integrated circuit 1.

The first terminal regions 45 are connected by means of via holes 50 to second terminal regions 40, which are provided on the second surface 10b of the carrier device 10.

By means of further connections that are not represented any more specifically, the second terminal regions 40 are connected to a tester device 400, which applies to the regions 60 predeterminable electrical signals, which are to be transferred to the chip 1 to be tested.

The interconnects 55', mounted elastically on the elastic elevations 15, 15', are arranged in such a way that a contact region 2, 2' of the chip corresponds to each region 60. With its contact areas adjusted, the chip is placed onto the contacting device formed in this way and is pressed into place by means of pressure P, as represented in FIG. 6.

Figure 2A:
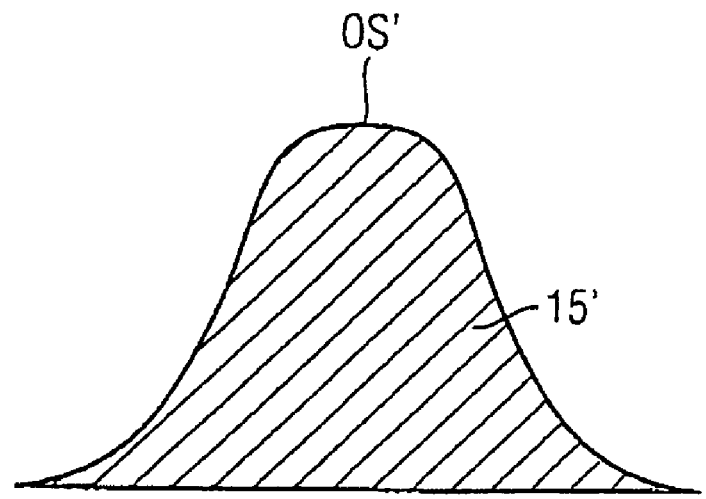
FIGS. 2a,b are cross-sectional views of elastic contact elements of a known contacting device as described in published German patent application 103 24 450 A1 along the line A-A' in FIG. 1.

FIGS. 2a,b are cross-sectional views of elastic contact elements of the known contacting device according to DE 103 24 450 A1 along the line A-A' in FIG. 1.

FIG. 2a shows the elastic elevation 15' of the elastomer directly after its production by dispensing.

Figure 2B:
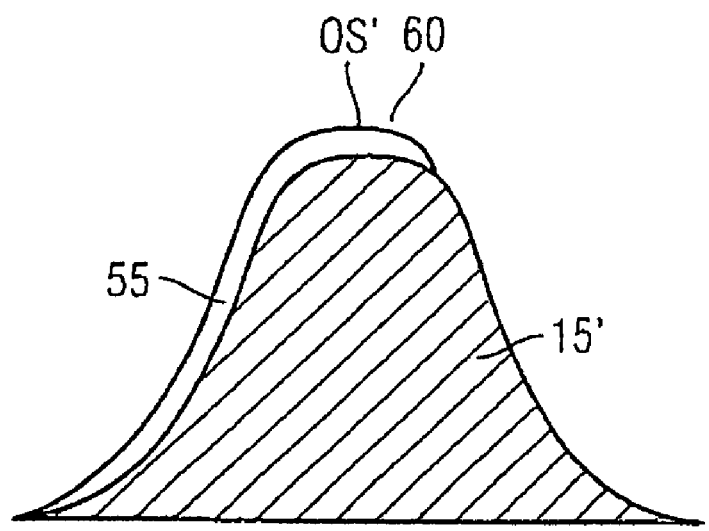

FIG. 2b shows the elastic elevation 15' after an interconnect 55 comprising the layer construction of copper, nickel and hard gold has been applied to its upper side OS' in an electrodepositing process. The contact area to be contacted of the electrical circuit, which is produced from aluminum, has a thin oxide film. Tests have shown that low-impedance contacting for electrical testing or burn-in is not possible with such a known contacting device.

Figure 3:
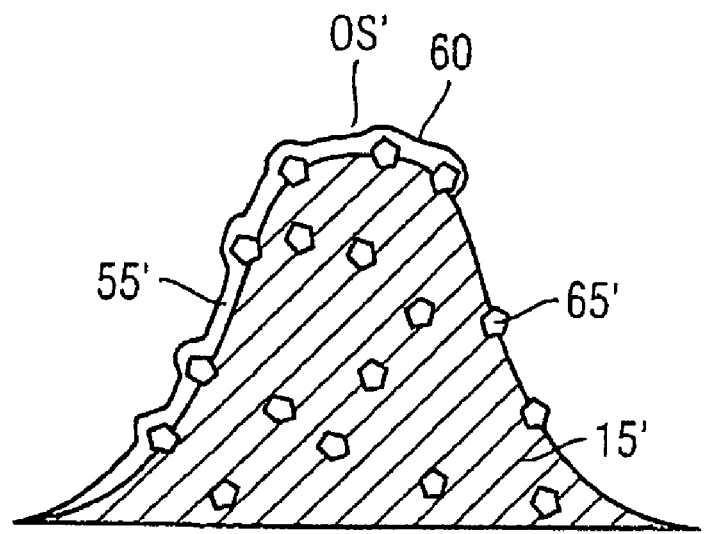
FIG. 3 is a cross-sectional view of an elastic contact element of an contacting device according to the first embodiment of the present invention along the line A-A' in FIG. 1.

FIG. 3 is a cross-sectional view of an elastic contact element of a contacting device according to a first embodiment of the present invention along the line A-A' in FIG. 1. In the case of the embodiment shown in FIG. 3, particles 65'—for example silicon oxide—are embedded in the elastomer of the elastic elevation 50'. The particles 65' are sharp-edged and preferably much harder than aluminum. The grain size and the grain size distribution depend on the size of the contact areas to be contacted of the integrated circuit and typically lie in the range from 3 to 20 µm. The particles 65' located at the surface provide the roughness of the interconnect 55' deposited over them, since, given an appropriately chosen thickness of the interconnect 55', their contours are molded onto the latter.

Figure 4:
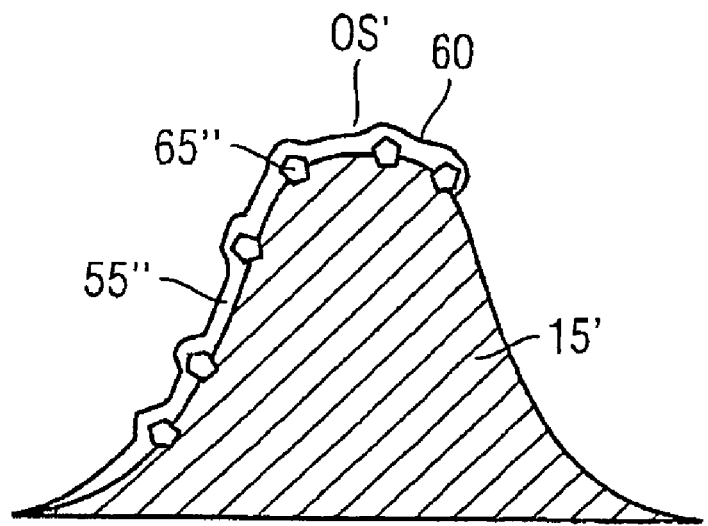
FIG. 4 is a cross-sectional view of an elastic contact element of a contacting device according to a second embodiment of the present invention along the line A-A' in FIG. 1.

FIG. 4 is a cross-sectional view of an elastic contact element of a contacting device according to a second embodiment of the present invention along the line A-A' in FIG. 1.

As shown in the embodiment according to FIG. 4, it is sufficient if such particles 65" are merely provided on the surface of the elastic elevation 15'.

The particles 65' according to FIG. 3 may be mixed into the elastomer before processing. The particles 65" according to FIG. 4 are applied to the non-cured elastomer surface after processing and remain adhesively attached therein.

The particles 65' and 65", incorporated in or applied to the elastomer of the elastic elevation 15' according to FIG. 3 and FIG. 4, respectively, are, as mentioned above, molded by the interconnects 55' and 55", respectively, and consequently produce in the regions 60 very rough surfaces, which lead to reliable and low-impedance contacting of oxidized contact areas of the integrated circuit 2, 2' of the chip 1. Hard gold preferably comes into consideration as the final covering material of the interconnects 55' and 55". This would have the advantage that no oxide can form in the regions 60 in the first place and only the oxide of the chip contact areas has to be perforated.

Figure 5:
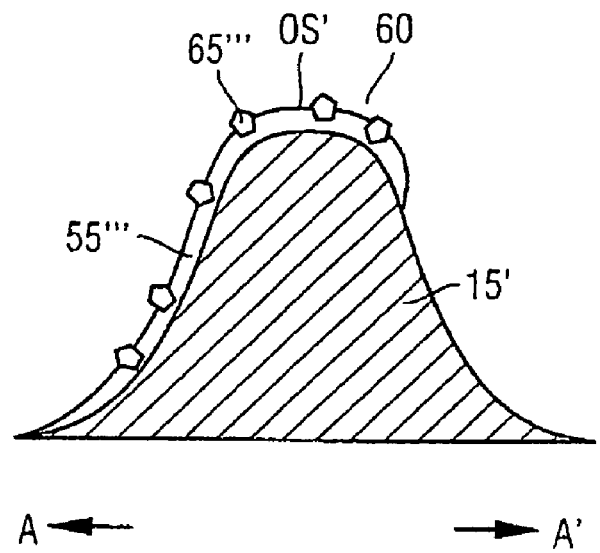
FIG. 5 is a cross-sectional view of an elastic contact element of a contacting device according to a third embodiment of the present invention along the line A-A' in FIG. 1.

FIG. 5 is a cross-sectional view of an elastic contact element of a contacting device according to a third embodiment of the present invention along the line A-A' in FIG. 1.

In the case of the embodiment according to FIG. 5, particles 65''' are integrated in the interconnect 55''' and not in the elastic elevation 15'. This may take place by embedding non-conducting or conducting particles 65''' in an electrodepositing process. Such dispersive, electrolytic depositing is also used for example in the production of grinding wheels. As an alternative to this, the embedding of such particles 65''' by a currentless depositing process is also possible. When non-conducting particles 65''' are used, they must be completely embedded; conducting particles 65''' may also be only partially embedded.

FIG. 6 is a cross-sectional view of two elastic contact elements of the contacting device according to a fourth embodiment of the present invention along the line A-A' in FIG. 1 with the chip placed on and pressed into place for testing.

In the case of the embodiment shown in FIG. 6, also represented in addition to the steps of the elastic elevations 15, 15', is a semiconductor chip 1 with contact regions 2, 2' of aluminum, which is pressed under pressure P onto the region 60 in such a way that the rough surface of the interconnects 554' perforates a thin aluminum oxide on the contact regions 2, 2', and consequently provides a reliable electrical contact.

A further special feature in the case of this embodiment is that the roughness of the interconnects 55'''' is achieved in the region 60 by protuberances 65'''', which can be realized by choosing the depositing parameters of the state of the bath in such a way that an incomplete protuberance-like deposition takes place. Such an incomplete protuberance-like deposition may take place, for example, by depositing hard gold on the elastic elevation 15, 15' or an interconnect of copper provided under it. High current densities and non-use of wetting agents in the bath promote such irregular electrodepositing. There are also analogous possibilities in the case of currentless depositing.

Although the present invention has been described above on the basis of preferred exemplary embodiments, it is not restricted to these but can be modified in various ways.

The present invention can in particular be applied not only to chips, but also to hybrids, wafers or other unpackaged integrated circuits or even more generally to components with terminals of superficially oxidizing materials.

We claim as our invention:

1. A contacting device, comprising:
   a carrier device with a first surface;
   a plurality of first terminal regions on said first surface; said plurality of first terminal regions being configured so that signals are fed to said plurality of first terminal regions;
   at least one elastic elevation on said first surface; said elastic elevation comprising an upper side; and
   a plurality of interconnects, each running from a respective of said first terminal regions to said upper side of said elastic elevation; said interconnects having first contact regions located at said upper side of said elastic elevation configured to be contacted electrically with corresponding second contact regions of an integrated circuit and said first contact regions comprising first particles for roughening the surface of said first contact regions.

2. The device of claim 1, wherein said elastic elevation comprises an elastomer and second particles for roughening the surface of said elastic elevation are incorporated or applied into said surface and are molded into said surface.

3. The device of claim 1, wherein said first particles have the form of protuberances.

4. The device of claim 1, wherein said first particles have a grain size in the range of 3 to 20 µm.

5. The device of claim 1, wherein said interconnects are made from copper.

6. The device of claim 1, wherein said interconnects are coated with nickel and subsequently with hard gold.

7. The device of claim 1, wherein said elastic elevation has an elongate wall-like shape.

8. The device of claim 7, wherein said elastic elevation is a first elastic elevation and said device comprises a second elastic elevation running parallel to said first elastic elevation.

9. The device of claim 1, comprising a plurality of second terminal regions connected to said first terminal regions via holes through said carder device which comprises a second surface; said plurality of second terminal regions being provided on said second surface.

\* \* \* \* \*